(12) United States Patent
Huang et al.

(10) Patent No.: US 11,747,937 B2
(45) Date of Patent: Sep. 5, 2023

(54) TOUCH DISPLAY PANEL AND MANUFACTURING METHOD THEREOF

(71) Applicant: HUIZHOU CHINA STAR OPTOELECTRONICS TECHNOLOGY CO., LTD., Guangdong (CN)

(72) Inventors: Dongchen Huang, Guangdong (CN); Chingyuan Cheng, Guangdong (CN)

(73) Assignee: HUIZHOU CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 455 days.

(21) Appl. No.: 16/982,254

(22) PCT Filed: Sep. 4, 2020

(86) PCT No.: PCT/CN2020/113480
§ 371 (c)(1),
(2) Date: Sep. 18, 2020

(87) PCT Pub. No.: WO2022/032765
PCT Pub. Date: Feb. 17, 2022

(65) Prior Publication Data
US 2023/0097945 A1    Mar. 30, 2023

(30) Foreign Application Priority Data
Aug. 11, 2020  (CN) .......................... 202010801404.6

(51) Int. Cl.
*G06F 3/041* (2006.01)
*H01L 25/075* (2006.01)

(52) U.S. Cl.
CPC ........ *G06F 3/04164* (2019.05); *G06F 3/0412* (2013.01); *H01L 25/0753* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 2017/0269749 A1* | 9/2017 | Bok | G02F 1/13338 |
| 2018/0182819 A1* | 6/2018 | Jo | H10K 59/122 |
| 2019/0012012 A1 | 1/2019 | Lai et al. | |
| 2019/0258346 A1 | 8/2019 | Cheng et al. | |
| 2020/0403026 A1* | 12/2020 | Li | H01L 33/60 |

FOREIGN PATENT DOCUMENTS

| | | |
|---|---|---|
| CN | 1744775 A | 3/2006 |
| CN | 105845708 A | 8/2016 |
| CN | 107450772 A | 12/2017 |
| CN | 108986678 A | 12/2018 |
| CN | 110214378 A | 9/2019 |
| CN | 110494911 A | 11/2019 |
| CN | 110850621 A | 2/2020 |
| CN | 111048685 A | 4/2020 |
| CN | 111413819 A | 7/2020 |

* cited by examiner

Primary Examiner — Brian M Butcher

(57) ABSTRACT

The present disclosure provides a touch display panel and a manufacturing method thereof. The present disclosure is a novel touch display panel that combines mini-LEDs and micro-LEDs with touch in a form of active light emission. The present disclosure arranges thin film transistors and touch electrodes on a substrate, so that the micro-LEDs or mini-LEDs can realize three-color display.

13 Claims, 6 Drawing Sheets

TOUCH DISPLAY PANEL AND MANUFACTURING METHOD THEREOF

FIELD OF INVENTION

The present disclosure relates to the field of display technology, in particular to a touch display panel with an active light emitting form LED and a manufacturing method thereof.

BACKGROUND OF INVENTION

In information society today, many information products have changed from traditional keyboard or mouse to touch sensing panels as input devices. Among them, touch display panels with both touch and display functions are have become one of the most popular products currently.

With current rapid development of mini-LEDs, micro-LEDs, and large-size touch panels, there is an urgent need for a large-size touch display with active light.

SUMMARY OF INVENTION

An object of the present disclosure is to provide a touch display panel, a new type of touch display panel in which mini-LEDs and micro-LEDs are combined with touch in the form of active light emission.

The present disclosure provides a touch display panel, including: a substrate includes a main display area and a non-display area;
  a plurality of first electrodes arranged on the substrate and corresponding to the main display area;
  a plurality of second electrodes arranged on the substrate and corresponding to the main display area, the plurality of first electrodes and the plurality of second electrodes are spaced alternating in sequence;
  a first insulating layer provided on the substrate and covers the plurality of first electrode and the plurality of second electrode, the first insulating layer is provided with a plurality of through hole corresponding to the plurality of first electrodes wherein the through hole extends to an upper surface of the first electrode;
  a connection layer provided on the first insulating layer and located in the through hole, and the connection layer is connected to the plurality of first electrode;
  a plurality of LEDs arranged on the first insulating layer and corresponding to the plurality of first electrodes and the plurality of second electrodes; and
  a plurality of thin film transistors arranged in the non-display area of the substrate.

Further, each of the thin film transistor includes: a gate provided on the substrate;
  a second insulating layer provided on the substrate and covers the gate;
  an active layer provided on the second insulating layer; and
  a source-drain layer arranged on the active layer and the second insulating layer.

Further, the plurality of LEDs include micro-LEDs or mini-LEDs.

Further, a material of the plurality of first electrode includes copper or molybdenum; and/or, a material of the plurality of second electrode includes copper or molybdenum; and/or, a material of the connection layer includes copper or molybdenum; and/or, the first insulating layer includes SiNx and SiO2.

Further, the plurality of gates, the plurality of first electrodes, and the plurality of second electrodes are arranged in the same layer; and/or the second insulating layer and the first insulating layer are provided in the same layer; and/or the source-drain layer and the connection layer are arranged in a same layer.

Further, the plurality of first electrode form a first electrode pattern in the display area; the plurality of second electrode form a second electrode pattern in the display area; and the first electrode pattern arranged horizontally, the second electrode pattern arranged horizontally, and the first electrode pattern and the second electrode pattern are not connected to each other.

Further, the source-drain layer includes a plurality of source electrodes and a plurality of drain electrodes, and the plurality of source electrodes and the plurality of drain electrodes are connected to the active layer.

Further, the thin film transistors include a low temperature polysilicon thin film transistors or an oxide thin film transistors.

The present disclosure also provides a method of manufacturing a touch display panel, including: providing a substrate and an LED, the substrate comprises a main display area and a non-display area;
  forming a first metal layer on the substrate, the first metal layer comprising a plurality of first electrodes, a plurality of second electrodes, and a plurality of gates that are spaced alternating in sequence, wherein the plurality of first electrodes and the plurality of second electrodes are provided on the main display area, the plurality of gates arranged in the non-display area;
  forming an insulating layer on the substrate, wherein the insulating layer comprises a first insulating layer and a second insulating layer, the first insulating layer disposed in the display area and covering the first electrode and the second electrode, the second insulating layer disposed in the non-display area and covering the gate;
  forming an active layer on the second insulating layer, and providing a plurality of through holes in the first insulating layer corresponding to the plurality of first electrodes, each of the through holes extending to an upper surface of the first electrode;
  forming a second metal layer on the insulating layer and the active layer, wherein the second metal layer comprises a connection layer and a source-drain layer, the connection layer arranged on the first insulating layer and in the through hole, the connection layer connects the first electrode, and the source-drain layers are provided on the active layer and the second insulating layer;
  patterning the plurality of first electrodes and the plurality of second electrodes to form a first electrode pattern and a second electrode pattern; and
  disposing and arranging the plurality of LEDs on the insulating layer, and the plurality of LEDs corresponds to the plurality of first electrodes and the plurality of second electrodes Further, the step of forming the active layer on the second insulating layer and opening the plurality of through holes in the first insulating layer corresponding to the plurality of first electrodes further includes:
  depositing a layer of active material on the insulating layer;
  photolithographically patterning the active material to form a through hole pattern and the active layer; and perforating the first insulating layer to form the plurality of through hole at the area of the hole pattern, wherein the plurality of through holes extend to the upper surface of the first electrodes.

The beneficial effects of the present disclosure are: one aspect of the present disclosure provides a touch display panel, which is a new type of touch display panel that combines mini-LEDs and micro-LEDs with touch function in the form of active light emission. The present disclosure arranges thin film transistors and touch electrodes on a substrate, so that micro-LEDs or mini-LEDs can realize three-color display. The present disclosure also provides a method of manufacturing the touch display panel, wherein when manufacturing, the touch electrode structure in the display area and the thin film transistor structure in the non-display area are prepared together, which can improve the efficiency of manufacturing.

DESCRIPTION OF FIGURES

The following describes the specific implementations of the present disclosure in detail with reference to the accompanying figures, which will make the technical solutions and other beneficial effects of the present disclosure obvious.

DETAILED DESCRIPTION OF PREFERRED EMBODIMENTS

The specific structure and functional details disclosed herein are only representative, and are used for the purpose of describing exemplary embodiments of the present disclosure. However, the present disclosure can be implemented in many alternative forms, and should not be interpreted as being limited to the embodiments set forth herein.

In the description of the present disclosure, it should be understood that the terms of center, longitudinal, transverse, length, width, thickness, upper, lower, front, rear, left, right, vertical, horizontal, top, bottom, inside, outside, clockwise, counterclockwise, etc. or a positional relationship based on orientation or position shown in the figures are only for the convenience of describing the present disclosure and simplifying the description, rather than indicating or implying the device or element referred to must have a specific orientation, structure, or operation. Therefore, it cannot be understood as a limitation of the present disclosure. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present disclosure, unless otherwise specified, "plurality" means two or more. In addition, the term "including" and any variations thereof is intended to cover non-exclusive inclusion.

In the description of the present disclosure, it should be noted that the terms "installation", "linked", and "connected" should be understood in a broad sense unless explicitly stated and limited otherwise. For example, it can be fixed connection, removable connection, or integral connection; it can be mechanical or electrical connection; it can be directly connected, indirectly connected through an intermediate medium, or it can be an internal communication of two elements. For those of ordinary skill in the art, the specific meanings of the above terms in the present disclosure can be understood on a case-by-case basis.

The terms used herein are only for describing specific embodiments and are not intended to limit the exemplary embodiments. Unless the context clearly dictates otherwise, the singular forms "a" and "one" used herein are also intended to include the plural. It should also be understood that the terms "including" and/or "comprising" used herein specify the existence of the stated features, integers, steps, operations, units and/or components, and do not exclude the existence or addition of one or more other features, integers, steps, operations, units, components, and/or combinations thereof.

Figure 1:
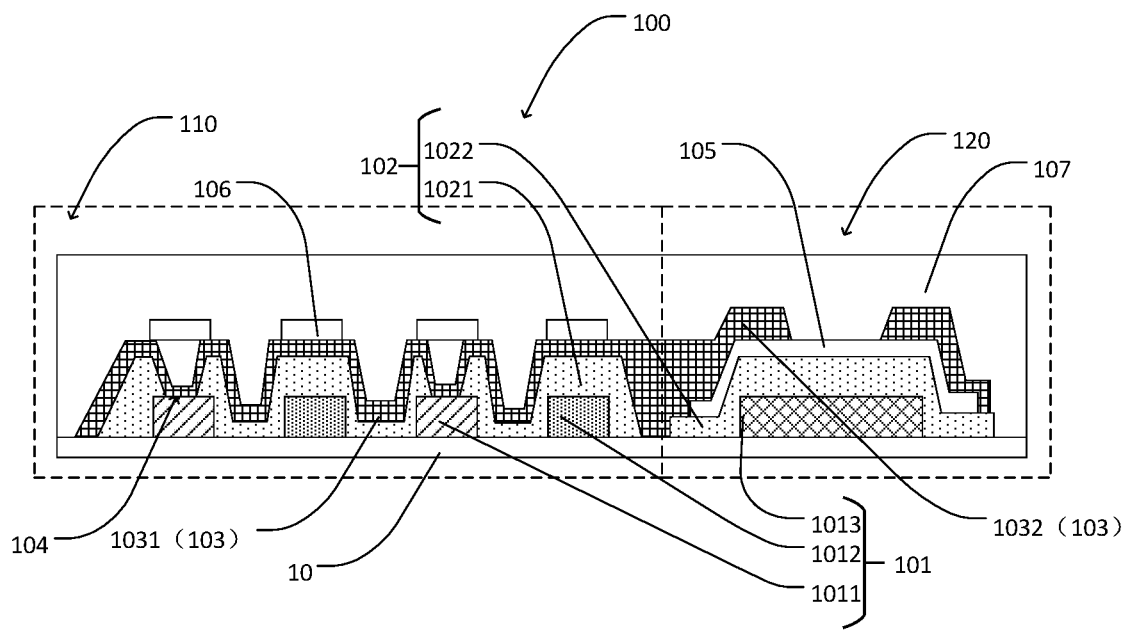
FIG. 1 is a schematic structural diagram of a touch display panel provided by the present disclosure.

As shown in FIG. 1, the present disclosure provides a touch display panel 100, including: a substrate 10, a plurality of first electrodes 1011, a plurality of second electrodes 1012, a first insulating layer 1021, a connection layer 1031, a plurality of LEDs 106, a plurality of thin film transistors, and a protective layer 107.

The substrate 10 includes a main display area 110 and a non-display area 120.

The plurality of first electrodes 1011 are arranged on the substrate 10 and correspond to the main display area 110, wherein the first electrodes 1011 are receiving electrodes (Rx).

The plurality of second electrodes 1012 are arranged on the substrate 10 and correspond to the main display area 110. The plurality of first electrodes 1011 and the plurality of second electrodes 1012 are spaced alternating in sequence from each other, wherein the second electrodes 1012 are transmission electrodes (Tx).

The first insulating layer 1021 is provided on the substrate 10 and covers the plurality of first electrodes 1011 and the plurality of second electrodes 1012, and the first insulating layer 1021 is provided with a plurality of through holes 104 corresponding to the first electrodes 1011, wherein the through holes 104 extend to an upper surface of the first electrodes 1011.

The connection layer 1031 is provided on the first insulating layer 1021 and located in the through holes 104, and the connection layer 1031 is connected to the plurality of the first electrodes 1011.

The plurality of LEDs 106 are arranged on the first insulating layer 1021 and correspond to the plurality of first electrodes 1011 and the plurality of second electrodes 1012. The LEDs 106 include micro-LEDs or mini-LEDs.

The plurality of thin film transistors are disposed in the non-display area 120 of the substrate 10.

Each of the thin film transistors includes a gate 1013, a second insulating layer 1022, an active layer 105, and a source-drain layer 1032.

The gate 1013 is provided on the substrate 10. The gate 1013, the first electrodes 1011, and the second electrodes 1012 are arranged in the same layer, and specifically arranged in a first metal layer 101.

The second insulating layer 1022 is provided on the substrate 10 and covers the gate 1013. The second insulating layer 1022 is provided in the same layer as the first insulating layer 1021, and specifically arranged in the insulating layer.

The active layer 105 is provided on the second insulating layer 1022.

The source-drain layer 1032 is provided on the active layer 105 and the second insulating layer 1022. The source-drain layer 1032 and the connection layer 1031 are arranged in the same layer, and specifically arranged in a second metal layer 103.

The source-drain layer 1032 includes a plurality of source electrodes and a plurality of drain electrodes, and the plurality of source electrodes and the plurality of drain electrodes are connected to the active layer 105.

The protective layer 107 is provided on the substrate 10 and covers the devices in the main display area 110 and the non-display area 120. The protective layer 107 may also be an encapsulation layer.

In one embodiment, a material of the first electrodes 1011 includes copper or molybdenum; and/or, a material of the second electrodes 1012 includes copper or molybdenum; and/or, a material of the connection layer 1031 includes copper or molybdenum; and/or, a material of the insulating layer includes SiNx and SiO2.

Figure 2:
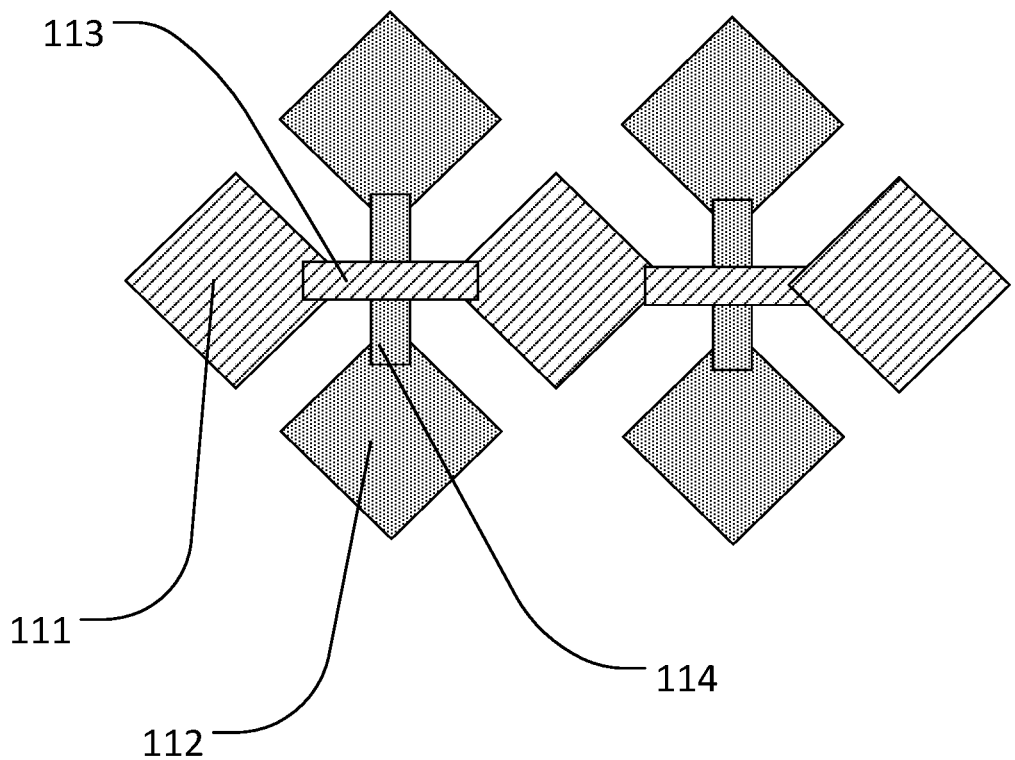
FIG. 2 is a plan view of pattern of a first electrode and a second electrode provided by the present disclosure.

As shown in FIG. 2, in one embodiment, the plurality of first electrodes 1011 form a first electrode pattern 111 in the display area; the plurality of second electrodes 1012 form a second electrode pattern 112 in the display area; and the first electrode pattern 111 is arranged horizontally, the second electrode pattern 112 is arranged horizontally, and the first electrode pattern 111 and the second electrode pattern 112 are not connected to each other.

Adjacent first electrode patterns 111 are connected through a first connecting line 113 (connection layer 1031 in FIG. 1), and need to be wired across the film layer; adjacent second electrode patterns 112 are connected through a second connecting line 114, the adjacent second electrode patterns 112 and the second connecting lines 114 are patterned on the first metal layer 101 together. The first electrode pattern 111 and the second electrode pattern 112 can realize the three-color display of the LEDs 106 of the touch display panel 100.

The present disclosure provides a touch display panel 100, which is a novel touch display panel 100 that combines mini-LEDs and micro-LEDs with touch in the form of active light emission. In the present disclosure, thin film transistors and touch electrodes are arranged on the substrate 10, so that micro-LEDs or mini-LEDs can realize three-color display.

The present disclosure also provides a method of manufacturing a touch display panel to prepare the touch display panel 100. The method of manufacturing the touch display panel specifically includes the following steps.

Figure 3:
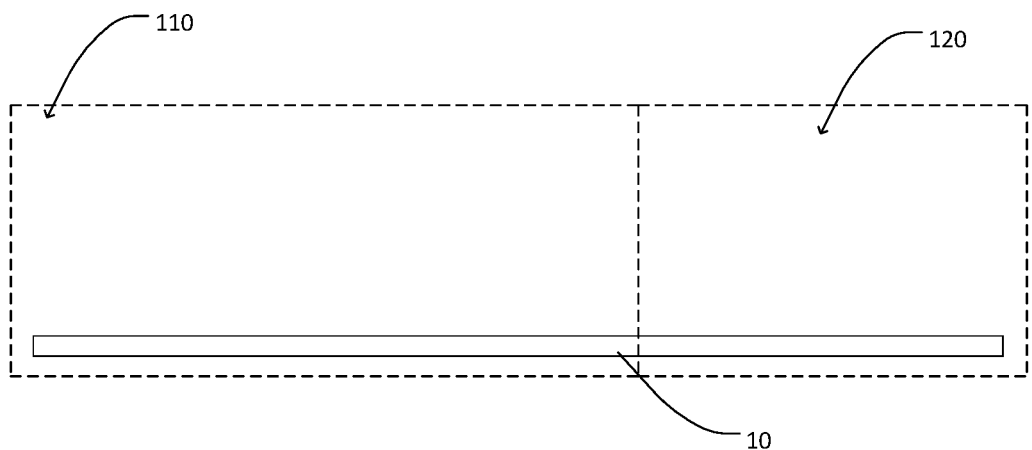
FIG. 3 is a schematic structural diagram of step S1 of a method of manufacturing the touch display panel provided by the present disclosure.

S1, as shown in FIG. 3, providing a substrate 10 and a plurality of LEDs 106. The substrate 10 includes a main display area 110 and a non-display area 120, the plurality of LEDs 106 include micro-LEDs or mini-LEDs.

S2, forming a first metal layer 101 on the substrate 10, the first metal layer 101 includes a plurality of first electrodes 1011, a plurality of second electrodes 1012, and a plurality of gates 1013 that are spaced alternating in sequence, the plurality of first electrodes 1011 and the plurality of second electrodes 1012 are arranged in the main display area 110, the plurality of gates 1013 are provided in the non-display area 120.

Specifically, step S2 includes the following steps S201 to S203.

Figure 4:
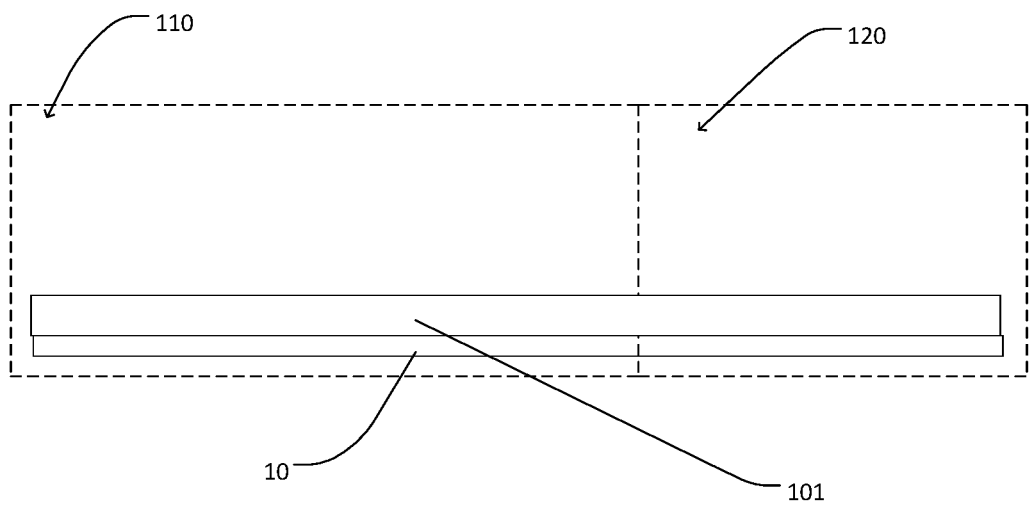
FIG. 4 is a schematic structural diagram of step S201 of the method of manufacturing the touch display panel provided by the present disclosure.

S201, as shown in FIG. 4, depositing a metal material on the substrate 10 to form the first metal layer 101.

Figure 5:
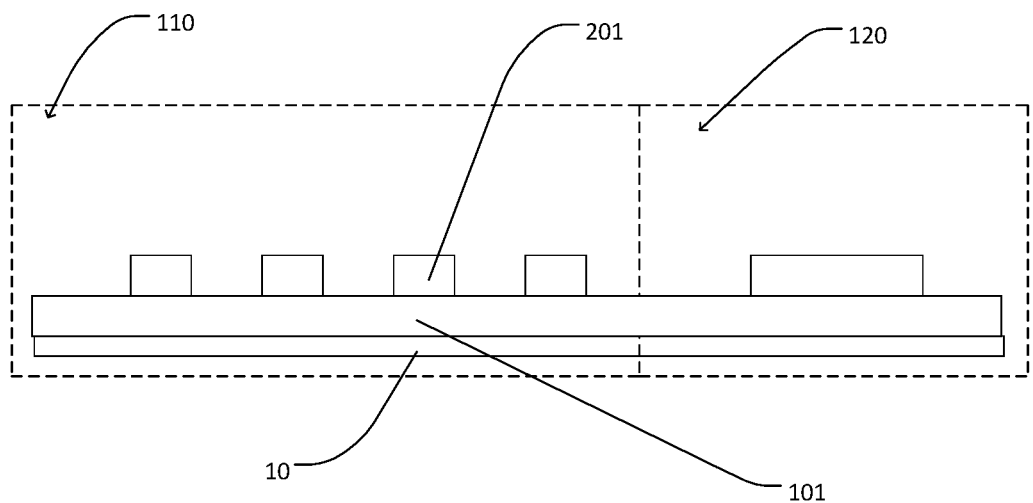
FIG. 5 is a schematic structural diagram of step S202 of the method of manufacturing the touch display panel provided by the present disclosure.

S202, as shown in FIG. 5, coating a photoresist on the first metal layer 101, and using a mask to expose and develop the photoresist to form an electrode pattern 201 (including the electrode pattern 112 of the plurality of first electrodes and the plurality of second electrodes of the main display area 110, and the gate pattern of the non-display area 120).

Figure 6:
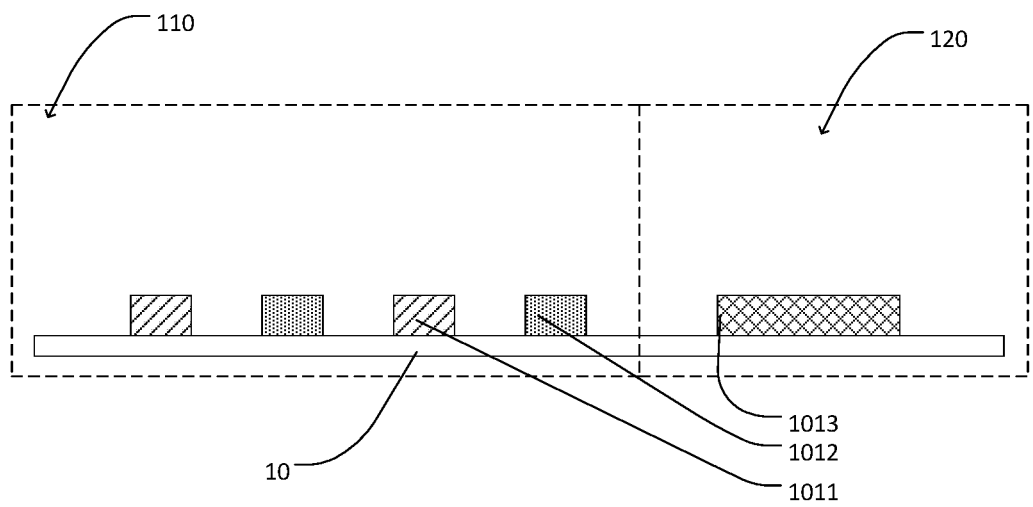
FIG. 6 is a schematic structural diagram of step S203 of the method of manufacturing the touch display panel provided by the present disclosure.

S203, as shown in FIG. 6, according to the electrode pattern, the first metal layer 101 is patterned by photolithography to form the plurality of first electrodes 1011, the plurality of second electrodes 1012, and the plurality of gates 1013.

Figure 7:
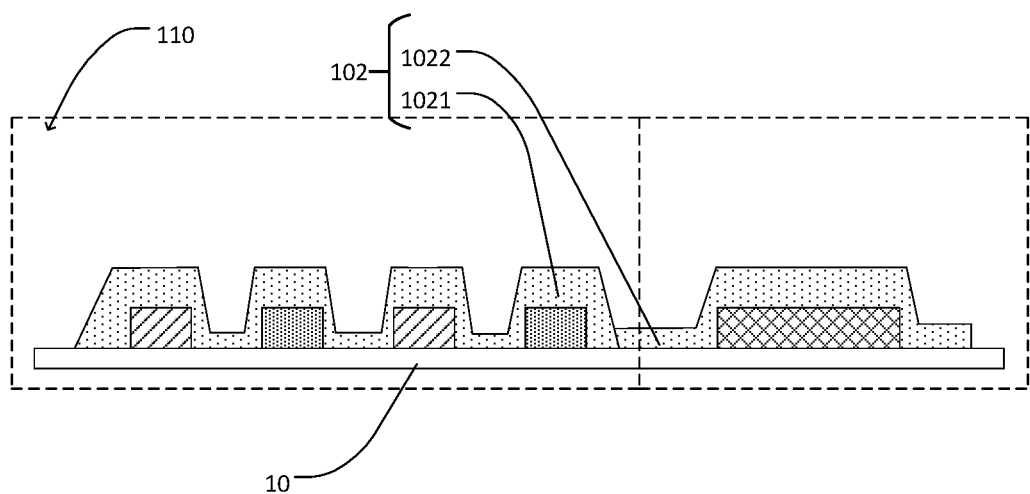
FIG. 7 is a schematic structural diagram of step S401 of the method of manufacturing the touch display panel provided by the present disclosure.

S3, as shown in FIG. 7, forming an insulating layer on the substrate 10. The insulating layer includes a first insulating layer 1021 and a second insulating layer 1022, and the first insulating layer 1021 is disposed in the display area and covering the plurality of first electrodes 1011 and the plurality of second electrodes 1012, and the second insulating layer 1022 is disposed in the non-display area 120 and covers the gates 1013.

Specifically, an insulating material such as SiNx, SiO2, etc. is deposited on the substrate 10 by chemical vapor deposition.

S4, forming an active layer 105 on the second insulating layer 1022, and opening a plurality of through holes 104 in the first insulating layer 1021 corresponding to the first electrodes 1011, and each of the through holes 104 extending to an upper surface of the plurality of first electrodes 1011.

The step of forming the active layer 105 on the second insulating layer 1022 and opening the plurality of through holes 104 in the first insulating layer 1021 corresponding to the plurality of first electrodes 1011 specifically includes the following steps S401 to S403.

S401, as shown in FIG. 7, depositing a layer of active material on the insulating layer, and the deposition method adopts a chemical vapor deposition method.

Figure 8:
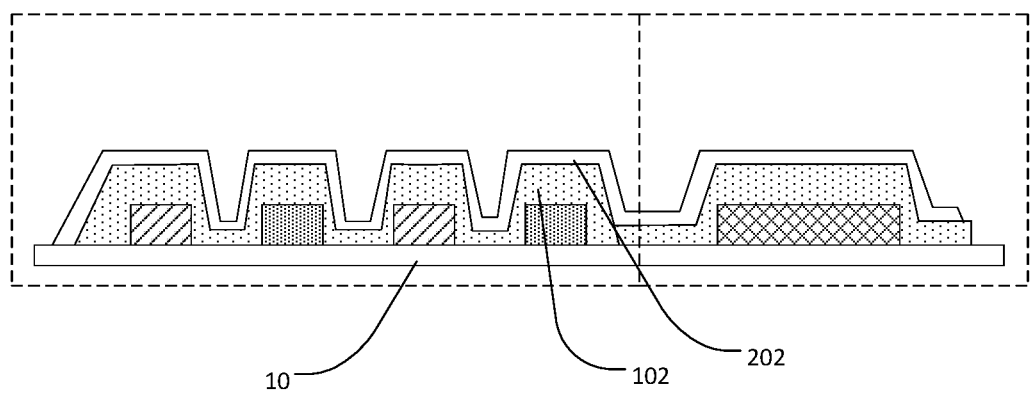
FIG. 8 is a schematic structural diagram of step S402 of the method of manufacturing the touch display panel provided by the present disclosure.

S402, as shown in FIG. 8, coating a layer of photoresist 202 on a surface of the active metal material, and then using a mask to expose and develop the photoresist to form a photoresist pattern (203 and 204). The photoresist pattern includes a through hole pattern 203 of the display area and an active layer pattern 204 of the non-display area 120.

Figure 9:
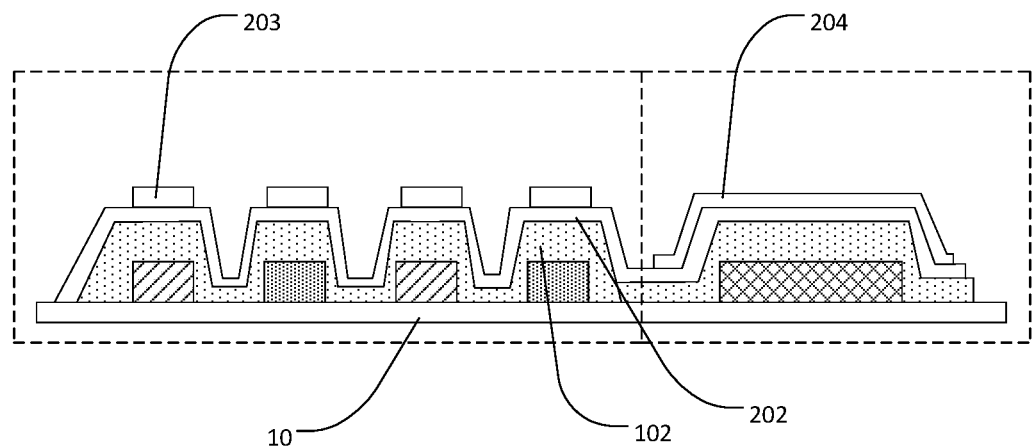
FIG. 9 is a schematic structural diagram of step S403 of the method of manufacturing the touch display panel provided by the present disclosure.
Figure 10:
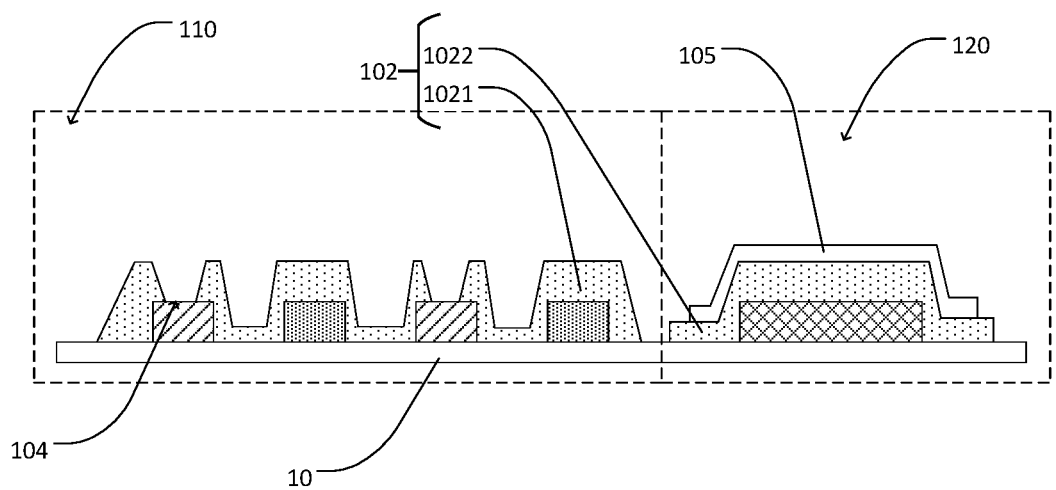
FIG. 10 is a schematic structural diagram of step S403 of the method of manufacturing the touch display panel provided by the present disclosure.

S403, as shown in FIG. 9 and FIG. 10, the active layer 105 is formed by patterning the active metal material according to the photoresist pattern, and etching to form a gap between the first insulating layer 1021 and the second insulating layer 1022.

Perforating the first insulating layer 1021 to form the plurality of through hole 104 at the area of the hole pattern, wherein the plurality of through holes 104 extend to the upper surface of the first electrodes 1011.

Figure 11:
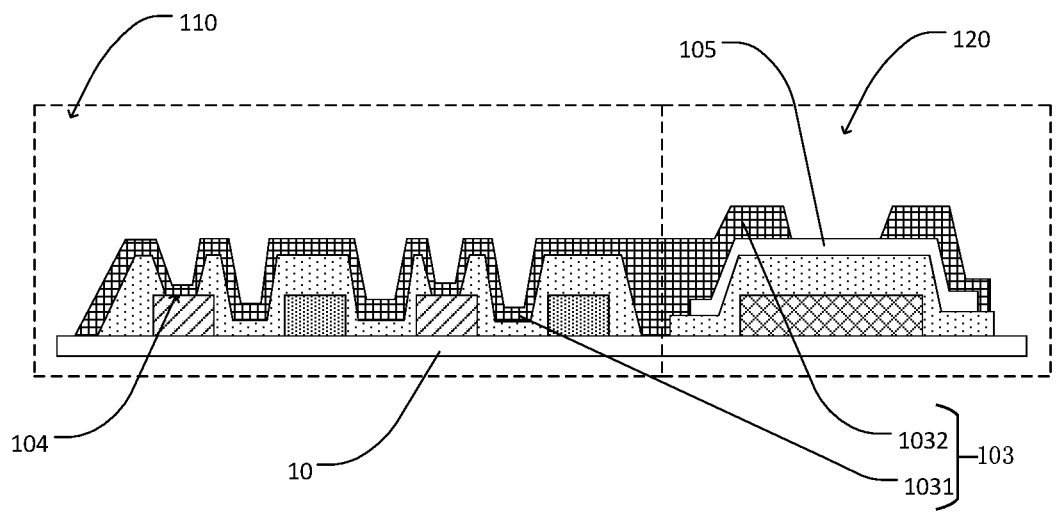
FIG. 11 is a schematic structural diagram of step S5 of the method of manufacturing the touch display panel provided by the present disclosure.

S5, as shown in FIG. 11, forming a second metal layer 103 on the insulating layer and the active layer 105. The second metal layer 103 includes a connection layer 1031 and a source-drain layer. The connection layer 1031 is disposed on the first insulating layer 1021 and located in the through holes 104, the connection layer 1031 connects the plurality of first electrodes 1011, and the source-drain layer 1032 is disposed on the active layer 105 and the second insulating layer 1022.

Specifically, step S5 specifically includes the following steps S501 to S502.

S501, depositing a metal material on the substrate 10 to form a second metal layer 103.

S502, photolithographically patterning the second metal layer 103 to form the connection layer 1031 and the source-drain layer.

S6, patterning the plurality of first electrodes 1011 and the plurality of second electrodes 1012 to form a first electrode pattern 111 and a second electrode pattern 112.

The first electrode pattern 111 is arranged horizontally, the second electrode pattern 112 is arranged horizontally, and the first electrode pattern 111 and the second electrode pattern 112 are not connected to each other.

Figure 12:
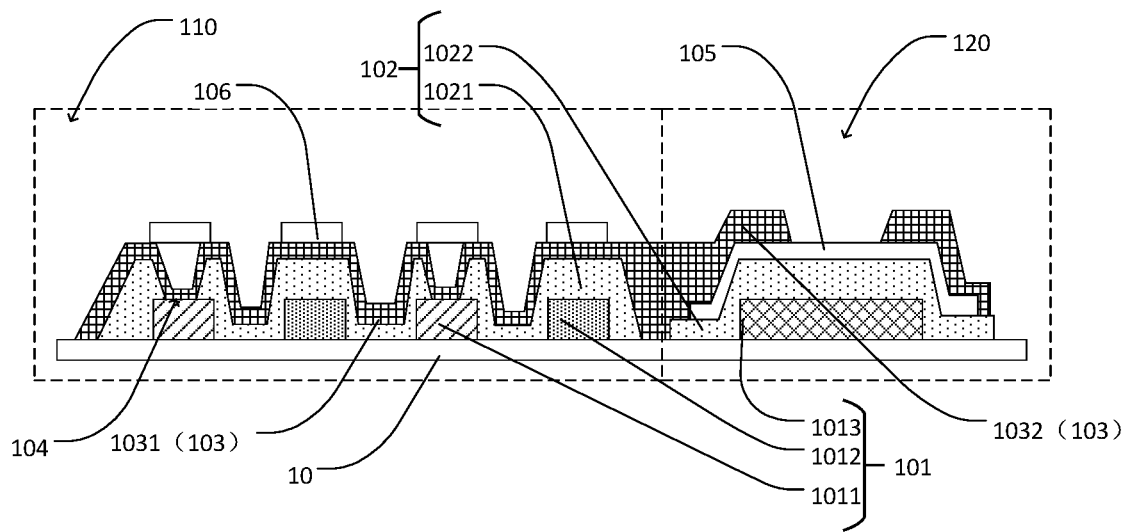
FIG. 12 is a schematic structural diagram of step S7 of the method of manufacturing the touch display panel provided by the present disclosure.

S7, as shown in FIG. 12, disposing and arranging the plurality of LEDs 106 on the insulating layer, and the plurality of LEDs 106 correspond to the plurality of first electrodes 1011 and the plurality of second electrodes 1012.

The present disclosure provides a method of manufacturing a touch display panel, which forms an active light-emitting touch display panel 100 by combining touch electrodes, mini-LEDs, micro-LEDs, and thin film transistors.

During manufacturing, the touch electrode structure in the display area and the thin film transistor structure in the non-display area 120 are prepared together, which can improve the efficiency of preparation.

In summary, although the present disclosure has been disclosed as above in preferred embodiments, the above-mentioned preferred embodiments are not intended to limit the present disclosure, and those of ordinary skill in the art can make various changes and modifications without departing from the spirit and scope of the present disclosure. The protection scope of the present disclosure is subject to the scope defined by the claims.

What is claimed is:

1. A touch display panel, comprising:
   a substrate comprising a main display area and a non-display area;
   a plurality of first electrodes arranged on the substrate and corresponding to the main display area;
   a plurality of second electrodes arranged on the substrate and corresponding to the main display area, wherein the plurality of first electrodes and the plurality of second electrodes are spaced alternating in sequence;
   a first insulating layer provided on the substrate and covering the plurality of first electrodes and the plurality of second electrodes, wherein the first insulating layer is provided with a plurality of through holes corresponding to the plurality of first electrodes, and the through holes extend to an upper surface of the first electrodes;
   a connection layer provided on the first insulating layer and located in the through holes, wherein the connection layer is connected to the plurality of first electrodes;
   a plurality of Light Emitting Diodes (LEDs) arranged on the first insulating layer and corresponding to the plurality of first electrodes and the plurality of second electrodes; and
   a plurality of thin film transistors arranged in the non-display area of the substrate,
   wherein each of the thin film transistors comprises:
      a gate provided on the substrate;
      a second insulating layer provided on the substrate and covering the gate;
      an active layer provided on the second insulating layer; and
      a source-drain layer arranged on the active layer and the second insulating layer, and
      wherein the source-drain layer and the connection layer are arranged in a same layer.

2. The touch display panel as claimed in claim 1, wherein the plurality of LEDs comprise micro-LEDs or mini-LEDs.

3. The touch display panel as claimed in claim 1, wherein a material of the plurality of first electrodes comprises copper or molybdenum.

4. The touch display panel as claimed in claim 1, wherein a material of the plurality of second electrodes comprises copper or molybdenum.

5. The touch display panel as claimed in claim 1, wherein a material of the connection layer comprises copper or molybdenum.

6. The touch display panel as claimed in claim 1, wherein the first insulating layer comprises Silicon Nitride (SiNx) and Silicon Oioxide (SiO2).

7. The touch display panel as claimed in claim 1, wherein the plurality of gates, the plurality of first electrodes, and the plurality of second electrodes are arranged in a same layer.

8. The touch display panel as claimed in claim 1, wherein the second insulating layer and the first insulating layer are provided in a same layer.

9. The touch display panel as claimed in claim 1, wherein the plurality of first electrodes form a first electrode pattern in the display area;
   the plurality of second electrodes form a second electrode pattern in the display area; and
   the first electrode pattern is arranged horizontally, the second electrode pattern is arranged horizontally, and the first electrode pattern and the second electrode pattern are not connected to each other.

10. The touch display panel as claimed in claim 1, wherein the source-drain layer comprises a plurality of source electrodes and a plurality of drain electrodes, and the plurality of source electrodes and the plurality of drain electrodes are connected to the active layer.

11. The touch display panel as claimed in claim 1, wherein the thin film transistor comprises a low temperature poly-silicon thin film transistor or an oxide thin film transistor.

12. A method of manufacturing a touch display panel, comprising following steps:
   providing a substrate and a plurality of Light Emitting Diodes (LEDs), the substrate comprising a main display area and a non-display area;
   forming a first metal layer on the substrate, the first metal layer comprising a plurality of first electrodes, a plurality of second electrodes, and a plurality of gates that are spaced alternating in sequence, wherein the plurality of first electrodes and the plurality of second electrodes are provided on the main display area, and the plurality of gates are arranged in the non-display area;

forming an insulating layer on the substrate, wherein the insulating layer comprises a first insulating layer and a second insulating layer, the first insulating layer is disposed in the display area and covers the first electrodes and the second electrodes, and the second insulating layer is disposed in the non-display area and covers the gates;

forming an active layer on the second insulating layer and providing a plurality of through holes in the first insulating layer corresponding to the plurality of first electrodes, wherein each of the through holes extends to an upper surface of the first electrodes;

forming a second metal layer on the insulating layer and the active layer, wherein the second metal layer comprising a connection layer and a source-drain layer, the connection layer is arranged on the first insulating layer and in the through holes, the connection layer connects the first electrodes, and the source-drain layer is provided on the active layer and the second insulating layer;

patterning the plurality of first electrodes and the plurality of second electrodes to form a first electrode pattern and a second electrode pattern; and disposing and arranging the plurality of LEDs on the insulating layer, wherein the plurality of LEDs correspond to the plurality of first electrodes and the plurality of second electrodes.

13. The method of manufacturing the touch display panel as claimed in claim 12, wherein the step of forming the active layer on the second insulating layer and providing the plurality of through holes in the first insulating layer corresponding to the plurality of first electrodes comprises:

depositing a layer of active material on the insulating layer;

photolithographically patterning the active material to form a through hole pattern and the active layer; and perforating the first insulating layer to form the plurality of through holes at the area of the hole pattern, wherein the plurality of through holes extend to the upper surface of the first electrodes.

* * * * *